United States Patent
von Koblinski et al.

(10) Patent No.: US 9,847,235 B2
(45) Date of Patent: Dec. 19, 2017

(54) SEMICONDUCTOR DEVICE WITH PLATED LEAD FRAME, AND METHOD FOR MANUFACTURING THEREOF

(71) Applicant: Infineon Technologies AG, Neubiberg (DE)

(72) Inventors: Carsten von Koblinski, Bodensdorf (AT); Ulrike Fastner, Villach (AT); Andre Brockmeier, Villach (AT); Peter Zorn, Villach (AT)

(73) Assignee: Infineon Technologies AG, Neubiberg (DE)

( * ) Notice: Subject to any disclaimer, the term of this patent is extended or adjusted under 35 U.S.C. 154(b) by 364 days.

(21) Appl. No.: 14/190,952

(22) Filed: Feb. 26, 2014

(65) Prior Publication Data
US 2015/0243591 A1    Aug. 27, 2015

(51) Int. Cl.
*H01L 21/52* (2006.01)
*H01L 21/78* (2006.01)
(Continued)

(52) U.S. Cl.
CPC .......... *H01L 21/52* (2013.01); *H01L 21/4803* (2013.01); *H01L 21/683* (2013.01); *H01L 21/78* (2013.01); *H01L 23/051* (2013.01); *H01L 23/492* (2013.01); *H01L 23/49861* (2013.01); *H01L 24/19* (2013.01); *H01L 24/20* (2013.01); *H01L 24/27* (2013.01); *H01L 24/29* (2013.01); *H01L 24/32* (2013.01); *H01L 24/73* (2013.01); *H01L 24/83* (2013.01); *H01L 24/92* (2013.01); *H01L 24/97* (2013.01); *H01L 23/3677* (2013.01); *H01L 2224/2101* (2013.01); *H01L 2224/214* (2013.01); *H01L 2224/215* (2013.01); *H01L 2224/221* (2013.01); *H01L 2224/2732* (2013.01); *H01L 2224/29011* (2013.01); *H01L 2224/2919* (2013.01);
(Continued)

(58) Field of Classification Search
None
See application file for complete search history.

(56) References Cited

U.S. PATENT DOCUMENTS

| 8,202,786 B2 | 6/2012 | von Koblinski et al. |
| 8,546,934 B2 | 10/2013 | von Koblinski et al. |

(Continued)

FOREIGN PATENT DOCUMENTS

| CN | 1222252 A | 7/1999 |
| CN | 1601772 A | 3/2005 |

(Continued)

OTHER PUBLICATIONS

Von Koblinski, C., et al., "Semiconductor Devices Having a Glass Substrate, and Method for Manufacturing Thereof." U.S. Appl. No. 13/894,682, filed May 15, 2013.

*Primary Examiner* — Abul Kalam
(74) *Attorney, Agent, or Firm* — Murphy, Bilak & Homiller, PLLC

(57) ABSTRACT

A carrier substrate having a plurality of receptacles each for receiving and carrying a semiconductor chip is provided. Semiconductor chips are arranged in the receptacles, and metal is plated in the receptacles to form a metal structure on and in contact with the semiconductor chips. The carrier substrate is cut to form separate semiconductor devices.

22 Claims, 7 Drawing Sheets

(51) Int. Cl.
*H01L 21/683* (2006.01)
*H01L 23/00* (2006.01)
*H01L 23/051* (2006.01)
*H01L 23/492* (2006.01)
*H01L 23/498* (2006.01)
*H01L 21/48* (2006.01)
*H01L 23/367* (2006.01)

(52) U.S. Cl.
CPC ............... *H01L 2224/29188* (2013.01); *H01L 2224/32105* (2013.01); *H01L 2224/32111* (2013.01); *H01L 2224/32155* (2013.01); *H01L 2224/32225* (2013.01); *H01L 2224/73267* (2013.01); *H01L 2224/82101* (2013.01); *H01L 2224/82105* (2013.01); *H01L 2224/82947* (2013.01); *H01L 2224/83192* (2013.01); *H01L 2224/83201* (2013.01); *H01L 2224/9202* (2013.01); *H01L 2224/92244* (2013.01); *H01L 2224/97* (2013.01); *H01L 2924/13055* (2013.01); *H01L 2924/15156* (2013.01); *H01L 2924/3511* (2013.01)

(56) References Cited

U.S. PATENT DOCUMENTS

| 8,552,829 | B2 | 10/2013 | Kroener et al. |
| 2003/0143776 | A1 | 7/2003 | Pedron, Jr. et al. |
| 2010/0127363 | A1* | 5/2010 | Nondhasitthichai .. H01L 21/561 257/673 |
| 2013/0228905 | A1 | 9/2013 | von Koblinski et al. |
| 2013/0241040 | A1* | 9/2013 | Tojo ....................... H01L 23/051 257/666 |
| 2013/0328183 | A1 | 12/2013 | von Koblinski et al. |
| 2013/0333203 | A1 | 12/2013 | Kroener et al. |
| 2014/0175624 | A1* | 6/2014 | Palm ........................ H01L 24/19 257/666 |

FOREIGN PATENT DOCUMENTS

| CN | 102376852 A | 3/2012 |
| DE | 102011051823 A1 | 4/2012 |
| DE | 102011055500 A1 | 5/2012 |

* cited by examiner

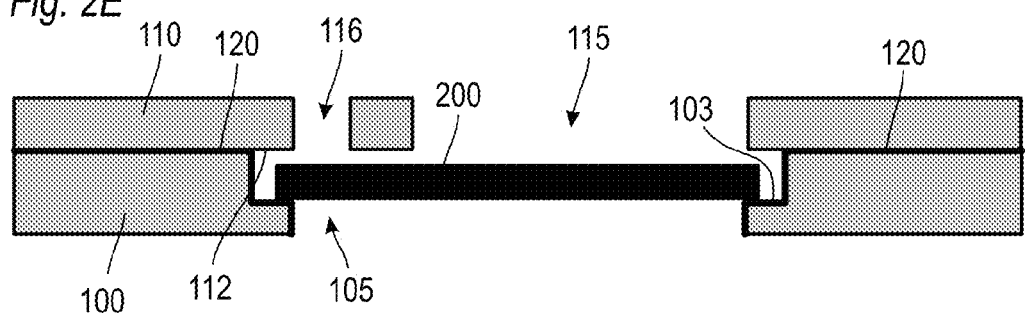
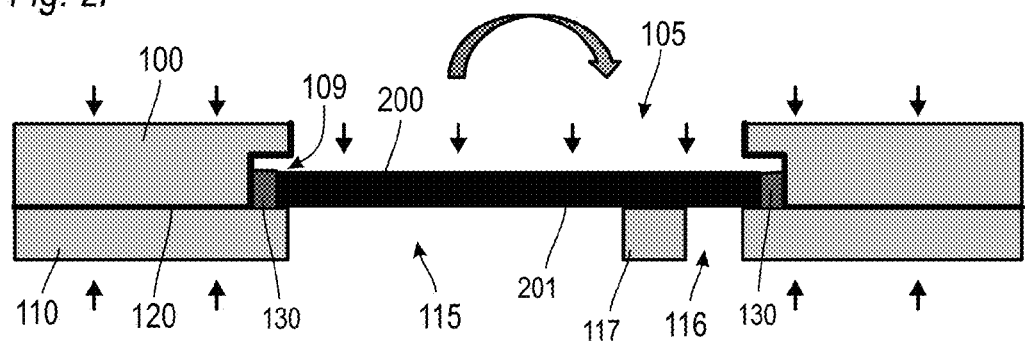
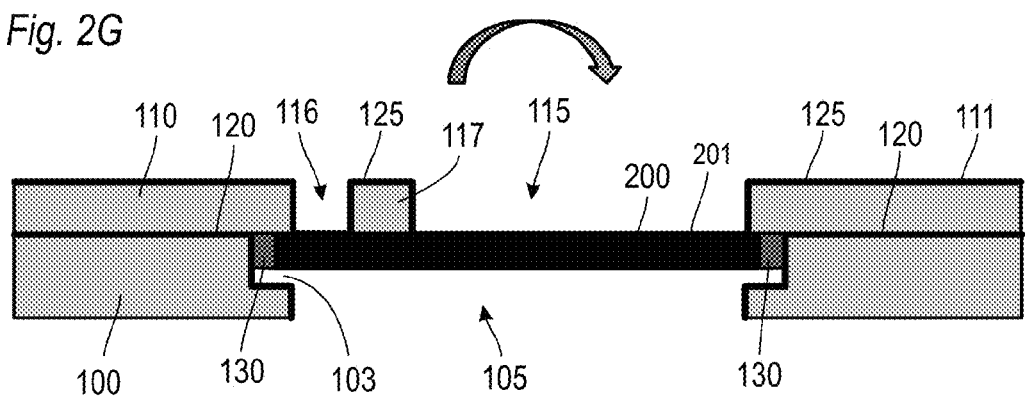

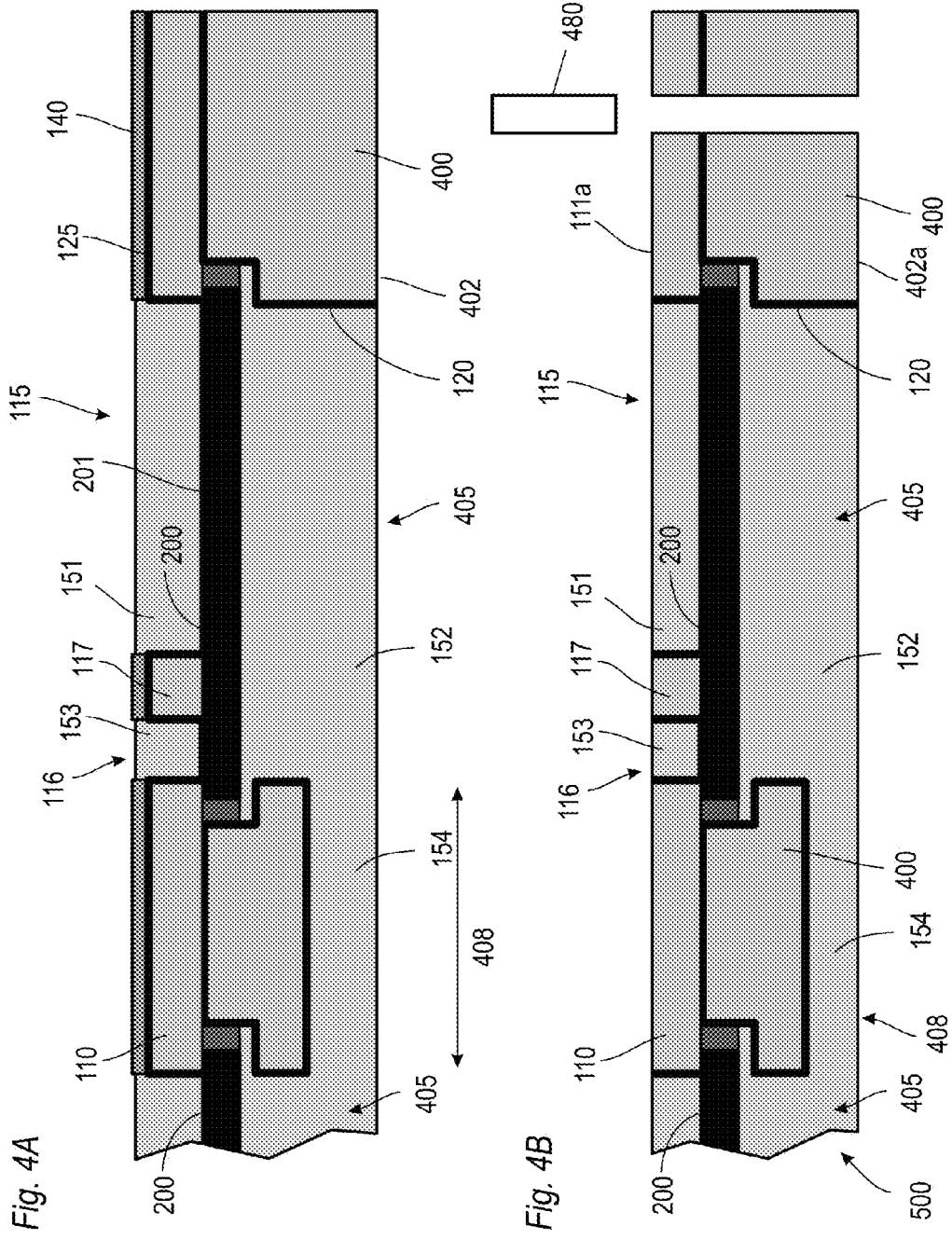

SEMICONDUCTOR DEVICE WITH PLATED LEAD FRAME, AND METHOD FOR MANUFACTURING THEREOF

TECHNICAL FIELD

Embodiments described herein relate to semiconductor devices having a plated lead frame and methods for manufacturing semiconductor devices.

BACKGROUND

Metal layers are formed on semiconductor materials to provide a good ohmic contact to the semiconductor material and to dissipate heat generated in the semiconductor material during operation of semiconductor devices integrated in the semiconductor material. Depending on the operation of the semiconductor devices, heat pulses may occur that need to be effectively dissipated.

Manufacturing of thick metallization layers can pose problems as the deposition techniques commonly used only allow deposition at low rate which causes long manufacturing times. Thick metallization layers can also cause mechanical stress due to the different coefficient of thermal expansion of the metal and the thin semiconductor material. Furthermore, the deposited metallization layers needs to be patterned which include additional manufacturing processes.

In view of the above, there is a need for improvement.

SUMMARY

According to an embodiment, a method for manufacturing semiconductor devices includes providing a carrier substrate having a first side, a second side and a plurality of receptacles each for receiving and carrying a semiconductor chip, the receptacles extending from the first side to the second side of the carrier substrate; placing semiconductor chips each having a first side and a second side in the receptacles, wherein the receptacles leave at least portions of the first side and of the second side of the semiconductor chips exposed; plating metal in the receptacles to form a metal structure on and in contact with the second side of the semiconductor chips; and cutting through the carrier substrate to form separate semiconductor devices.

According to an embodiment, a method for manufacturing semiconductor devices, includes providing a carrier substrate having a first side, a second side and a plurality of receptacles each for receiving and carrying a semiconductor chip, the receptacles extending from the first side to the second side of the carrier substrate; placing semiconductor chips each having a first side and a second side in the receptacles, wherein the receptacles leave at least portions of the first side and of the second side of the semiconductor chips exposed; providing a cover substrate having a first side, a second side, and a plurality of openings extending from the first side to the second side; joining the second side of the cover substrate with the first side of the carrier substrate and with the first side of the semiconductor chips, wherein the openings of the cover substrate leave respective portions of the first side of the semiconductor chips exposed; and plating metal in the receptacles and the openings to form at least a first metal structure on and in contact with the first side of the semiconductor chips, and a second metal structure on and in contact with the second side of the semiconductor chips.

According to an embodiment, a semiconductor device includes an insulating carrier structure made of an insulating inorganic material. The carrier structure includes at least one receptacle. A semiconductor chip having a first side, a second side and a lateral rim is disposed in the receptacle, wherein the carrier structure laterally surrounds the semiconductor chip and the lateral rim. A metal structure is arranged on and in contact with the second side of the semiconductor chip and embedded in the carrier structure.

Those skilled in the art will recognise additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference signs designate corresponding parts.

FIGS. 2A to 2M illustrate processes steps in a method for manufacturing a semiconductor device, according to an embodiment.

FIGS. 4A to 4B illustrate processes steps in a method for manufacturing a semiconductor device, according to an embodiment.

DETAILED DESCRIPTION

In the following Detailed Description, reference is made to the accompanying drawings, which form a part hereof, and in which are shown by way of illustration specific embodiments in which the invention may be practiced. In this regard, directional terminology, such as "top," "bottom," "front," "back," leading," "trailing," "lateral," "vertical" etc., is used with reference to the orientation of the Figure(s) being described. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

In this specification, a second surface of a semiconductor substrate is considered to be formed by the lower or backside surface while a first surface is considered to be formed by the upper, front or main surface of the semiconductor substrate. The terms "above" and "below" as used in this specification therefore describe a relative location of a structural feature to another structural feature with consideration of this orientation.

The terms "electrical connection" and "electrically connected" describe an ohmic connection between two elements.

An embodiment is described next with reference to FIGS. 1A to 1E. This embodiment includes formation of a semiconductor device having a plated lead frame embedded in an insulating carrier substrate.

Figure 1A:
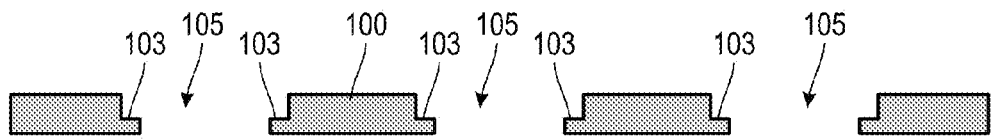
FIGS. 1A to 1E illustrate processes steps in a method for manufacturing a semiconductor device, according to an embodiment.
Figure 1B:
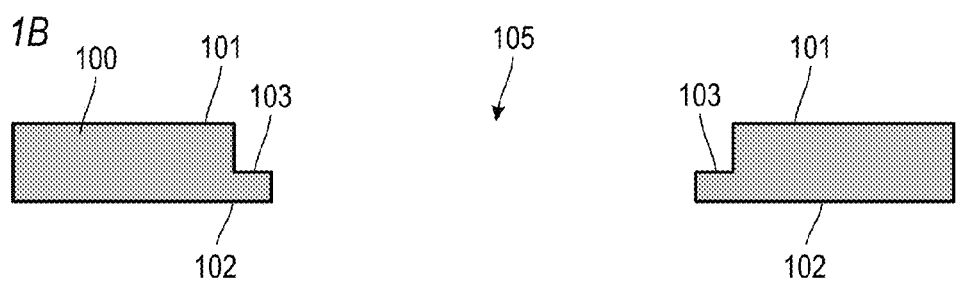

With reference to FIGS. 1A and 1B, a carrier substrate 100 is provided having a first side 101 and a second side 102 opposite the first side 101 as best shown in FIG. 1B which illustrates an enlarged portion of FIG. 1A.

The carrier substrate 100 includes a plurality of receptacles 105. Each receptacle 105 is sized and shaped for receiving and carrying a semiconductor chip. The receptacles 105 extend from the first side 101 of the carrier substrate 100 to the second side 102 of the carrier substrate 100 and are formed through openings in the carrier substrate 100.

The carrier substrate 100 can be a wafer to allow simultaneous processing of individual semiconductor chips as described below in connection with one single semiconductor chip. The following description is therefore not limited to a single semiconductor chip and also encompasses the simultaneous processing of multiple semiconductor chips in respective receptacles 105 of the carrier substrate 100.

Figure 1C:
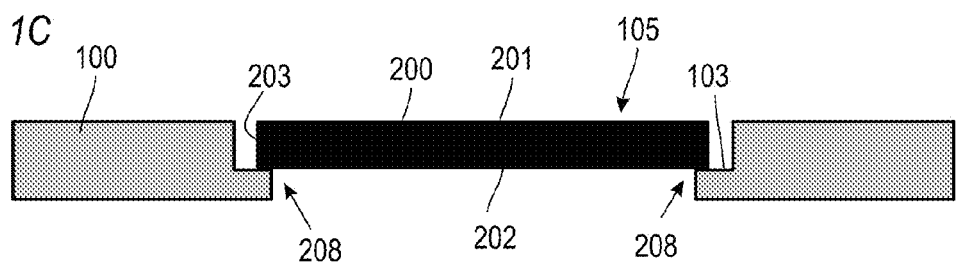

In a further process as best shown in FIG. 1C, a semiconductor chip 200 having a first side 201, a second side 202, and a lateral rim 203 is placed in a receptacle 105. As illustrated in FIG. 1C, the receptacle 105 includes a peripheral stepped portion 103 for holding and carrying the semiconductor chip 200. Typically, each receptacle 105 receives a single semiconductor chip 200. The receptacle 105 leaves at least portions of the first side 201 and of the second side 202 of the semiconductor chip 200 uncovered.

The semiconductor chip 200 can be made of any semiconductor material suitable for manufacturing semiconductor components. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon ($Si_xC_{1-x}$) and SiGe heterojunction semiconductor material. For power semiconductor applications currently mainly Si, SiC and GaN materials are used.

Figure 1D:
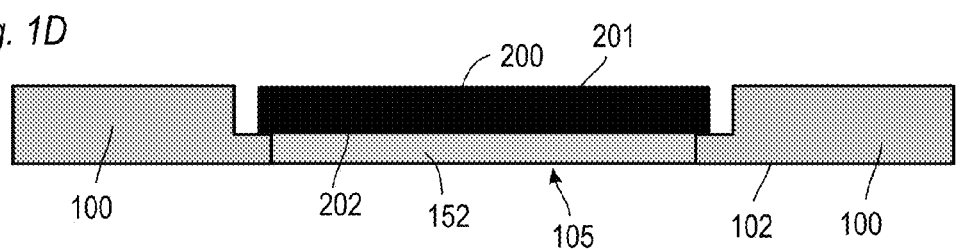

In a further process as shown in FIG. 1D, metal is plated in the receptacle 105 from the second side 102 of the carrier substrate 100 to form a metal structure 152 on and in contact with the second side 202 of the semiconductor chip 200. Typically, the metal structure 152 flushes with the second side 102 of the carrier substrate 100. As the metal can grow over the second side 102 of the carrier substrate 100 when plating, grinding of the carrier substrate 100 and the metal structure 152 can be used to obtain a flat surface.

Figure 1E:
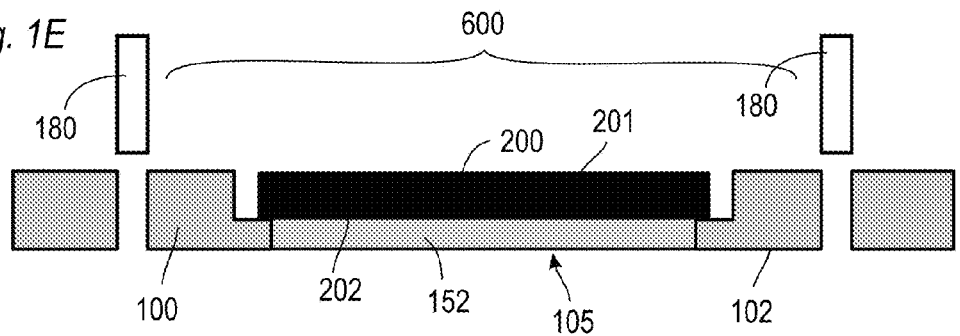

In a further process, the carrier substrate 100 is cut, for example by a saw 180 or a laser, to form separate semiconductor devices 600. Other cutting processes, for example scribing and breaking, are also suitable. The cut lines are spaced from the lateral rim 203 of the respective chips 200 so that the semiconductor chips 200 are not cut. As only the carrier substrate 100 is cut, cutting tools adapted to the material of the carrier substrate 100 can be used which improves the quality of the cutting. The semiconductor chips 200 are not cut. Chipping of the carrier substrate 100 and contamination of the semiconductor chips 200 can be avoided. Furthermore, the lateral rim 203 of the semiconductor chips 200 also remains embedded in the carrier substrate 100. As shown in FIG. 1E, the glass substrate 100, after cutting, laterally surrounds the semiconductor chip 200 and protects the laterally rim 203 of the semiconductor chip 200.

Furthermore, the hybrid structure formed by the cut carrier substrate 100 and the chip 200 provides sufficient mechanical stability for the chips 200. Thin chips 200 can thus be reliably handled.

The carrier substrate 100 can be an inorganic insulating material. Suitable inorganic insulating materials are amorphous or polycrystalline insulating materials. Examples are glass substrates and ceramics.

As illustrated in FIG. 1D, each chip 200 is individually provided with a separate metal structure 152. This process can also be referred to as direct-metallization of individual chips 200. Individual chips 200 are different to wafers, as chips 200 are formed by cutting a semiconductor wafer material having a plurality of individual semiconductor components. The wafer is cut along lines running between adjacent semiconductor components to form separate semiconductor chips each including a semiconductor component.

According to an embodiment, the semiconductor chips are formed by processing a semiconductor wafer to form a plurality of semiconductor components, and cutting the semiconductor wafer to form separate semiconductor chips each including a semiconductor component.

The metal structure 152 forms an "in-situ" plated lead frame embedded in the carrier substrate 100 as the lead frame is laterally surrounded by the carrier substrate 100. The carrier substrate 100 thus provides an electrical insulation laterally surrounding the semiconductor chip 200 and the metal structure 152 while leaving a bottom surface of the metal structure 152 exposed. Electrical connection to the semiconductor chip 200 and the semiconductor component integrated in the semiconductor chip 200 can be provided on the bottom surface of the metal structure 152.

The direct formation of the lead frame on the semiconductor chip 200 by plating avoids soldering processes which are commonly used to join a separately formed lead frame with the back-side of semiconductor chips. Problems associated with soldering, such as contamination by flux, creeping solder, or formation of voids in the solder layer, can thus be avoided. This improves the electrical and thermal contact between the lead frame formed by the metal structure 152 and the semiconductor chip 200. Furthermore, thermo-mechanical stress which occurs during soldering can also be avoided.

Different to common approaches, the lead frame formed by the metal structure 152 is integrally formed on the semiconductor chip 200 without any solder interface between the semiconductor chip 200 and the lead frame 152.

As the plating takes place on each individual chip 200, bowing of the chips 200 can be reduced or completely avoided since the size of the chips 200 is much smaller than the size of a semiconductor wafer. This is also beneficial for further processes.

The processes described herein allows for the formation of packages with thin chips integrally formed with lead frames without using soldering processes. The lead frame, which is formed by the metal structure 152, is directly formed on the back-side metallization of the semiconductor chip 200. Typically, each semiconductor component integrated in a semiconductor chip 200 is provided with a back-side metallization, and also a front-side metallization. The back-side and front-side metallization is each formed on semiconductor wafer level before separating the semiconductor chips 200 by cutting the semiconductor wafer. The back-side and front-side metallization can have a thickness of, for example, 0.5 μm to 3 μm, particularly 1 to 2 μm. The back-side and/or front-side metallization can be a single metal layer or metal layer stack. An example is AlTiAg with Ag being the exposed or upper metal layer of the metal layer stack.

The plated metal structure 152 can have a thickness of about 30 μm to about 500 μm, for example between about 30 μm or 50 μm and 300 μm, or between 30 μm and 100 μm. The thickness of the plated metal structure 152 is typically larger than 30 μm. In further embodiments, the thickness of the plated metal structure 152 is typically equal to or larger than 300 μm.

The final thickness ratio between the back-side metallization and the metal structure 152 can be between about 1:50 to about 1:300. Such thickness ratio can be adjusted by a final mechanical processing step which can include grinding of the carrier substrate 100 and the metal structure 152 to yield a planar metal and carrier substrate surface or thinning of the metal structure 152 and the carrier substrate 100 to yield a certain stack thickness.

Such thick metal structures 152 are typically not formed on wafer level as the thick metal structures can cause substantial bowing of the wafer. Different thereto, bowing of the chips 200 is avoided as the chips are laterally much smaller than wafers.

Depending on the rated blocking voltage of the semiconductor component, integrated in the semiconductor chips 200, the thickness of the semiconductor chips 200 varies. For example, the semiconductor chips 200 can have a thickness of about 50 to 150 μm, typically 70 μm or below.

The carrier substrate 100 typically has a thickness larger than the final thickness of the metal structures 152. The thickness of the carrier substrate 100 can be, for example 200 to 500 μm and typically 300 to 400 μm to provide sufficient space for receiving the semiconductor chips 200 and for forming the embedded metal structures 152. Furthermore, the given thickness provides sufficient mechanical stability.

The receptacles 105 of the carrier substrate 100 can be formed such that the opposing sides 201, 202 of the semiconductor chips 200, or only one of the sides 201, 202, are recessed with respect to the sides 101, 102 of the carrier substrate 100. The sides 101, 102, or at least one of the sides 101, 102 of the carrier substrate 100, project the respective sides 201, 202 of the semiconductor chip 200 to provide sufficient internal space for forming the metal structure 152.

FIGS. 1A to 1E shows the formation of separate metal structures 152 each for an individual semiconductor chip 200. According to an embodiment, a common metal structure can also be formed for a group of individual chips 200 to form a circuit including at least two separate chips 200. Hybrid circuit arrangements such as inverters can thus be formed. The hybrid circuit arrangement can include at least two chips 200 each including a semiconductor component such as a power transistor and a power diode. The electrical connection between the individual chips 200 can be formed by the common metal structure which also functions as common lead frame.

The direct formation of the lead frame or common lead frame on the semiconductor chip 200 improves heat dissipation for medium long heating pulses. Typically, a distinction is made between short heating pulses, medium heating pulses, and permanent heating pulses.

A short heating pulse occurs during short breakdown between about 3 μs and 10 μs. The heating pulse generated by a short breakdown can be typically absorbed by the semiconductor material. The heat is then subsequently dissipated to the lead frame and the surroundings. The directly or in-situ formed-metal structure 152 acts here as an additional heat-capacitor and is attached without any solder to the source of the heat, e.g. drain of the semiconductor chip 200.

A medium heating pulse occurs during medium breakdowns between about 1 ms and 100 ms. The heating pulse generated by a medium breakdown needs to be absorbed by the lead frame as the heat capacity of the semiconductor material is too small due to the comparably small volume of thin semiconductor chips. As no soldering interface is formed by the direct formation of the lead frame, the de-heating of the semiconductor chip 200 is improved. The whole volume of the lead frame can thus contribute the heat dissipation.

A permanent heat generation occurs during operation of the semiconductor chips and has to be transported effectively to the ambiance. Directly formed lead frames as described herein facilitates the heat dissipation for continuous heating as the heat transport is not impeded by a soldering interface.

With reference to FIGS. 2A to 2M, a more detailed embodiment is explained. Same reference signs are used for corresponding parts which are also shown in the FIGS. 1A to 1E.

In the following description, the carrier substrate 100 is formed by a first glass substrate 100 without being limited to glass materials. Typically, a glass wafer is used having a thickness of at least 400 μm.

Figure 2A:
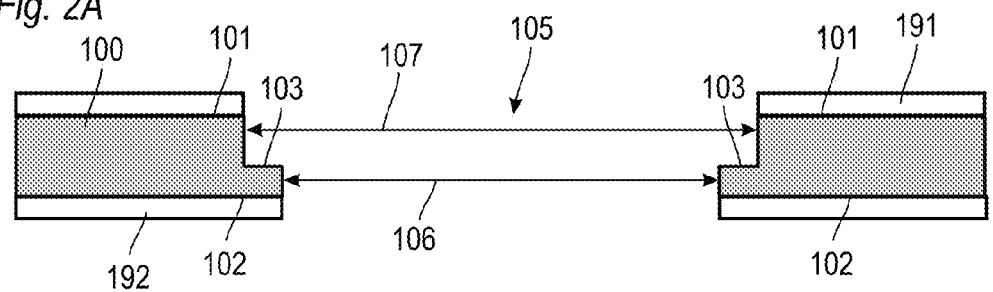

For better illustration purposes only, FIG. 2A illustrates only a single receptacle 105 of the first glass substrate 100, which typically includes a plurality of receptacles 105.

According to an embodiment, the first glass substrate 100 having receptacles 105 is provided, as illustrated in FIG. 2A. The receptacles 105 can be formed, for example, by wet-chemical etching using a first mask 191 formed on the first side 101 of the first glass substrate 100 and a second mask 192 formed on the second side 102 of the first glass substrate 100. Each mask 191, 192 defines the size and location of openings or cavities 106, 107 to be formed in the first glass substrate 100. The openings of the first and second mask 191, 192 are aligned with each other so that corresponding openings in the first and second mask 191, 192 overlap each other. The opening in the first mask 191 is larger than the opening in the second mask 192 and fully covers the opening in the second mask 192 when seen in a vertical projection onto the second side 102 of the first glass substrate 100. The size of the opening in the first mask 191 is adapted to be larger than the size of the semiconductor chip to allow that the semiconductor chip 200 can be placed into the receptacle 105. Different thereto, the size of the opening in the second mask 192 is smaller than the size of the semiconductor chip 200.

The first glass substrate 100 is then etched using the first and the second mask 191, 192 as etching masks. HF can be used, for example, for wet-chemical etching. An alkaline solution can be used to remove the first and second mask 191, 192 from the first glass substrate 100.

The openings 106 and 107, which are formed from opposing sides 101, 102 of the first glass substrate 100, together form the receptacles 105. Due to the different size of the openings in the first and second mask 191, 192, a step 103 is formed where the advancing etching fronts meet. Typically, the first glass substrate 100 is first etched from one side and subsequently from the other side. The order of etching is not limited. Separate etching processes allow an individual adjustment of the etching depth for each of the openings 107 and 106 and thus of the vertical location—relative to the thickness direction of the first glass substrate 100—of the step 103. Alternatively, the first glass substrate 100 can be etched in a single etching step from both side 101, 102.

The step 103 forms a peripheral stepped region 103 of the receptacle 105. The step 103 is the result of the different size of the openings 106 and 107.

Alternatively, laser milling can be used to provide the receptacles 105 with a peripheral stepped region 103.

The first glass substrate 100 is thus double-sided processed to form the receptacles 105 each having the peripheral stepped portion 103.

Figure 2B:
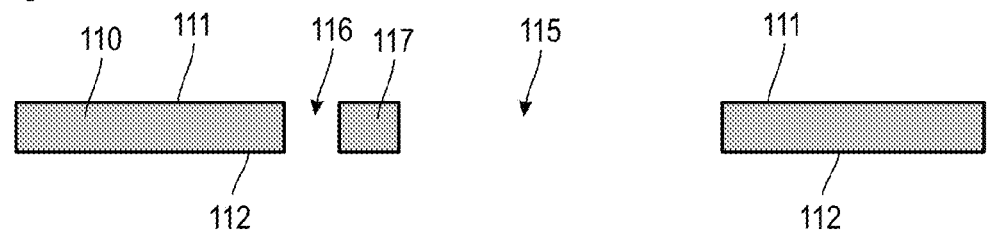

In a further process as illustrated in FIG. 2B, a cover substrate 110 having a first side 111, a second side 112, and a plurality of openings 115, 116 extending from the first side 111 to the second side 112 is provided. The cover substrate 110 can be of the same material as the first glass substrate 100 such as glass or ceramic. In the following, the cover substrate 110 is referred to as second glass substrate 110.

The second glass substrate 110 can have a thickness of at least 300 to 550 µm to be mechanically stable. The size of the second glass substrate 110 can be approximately equal to the size of the first glass substrate 100. FIG. 2B shows only a portion of the second glass substrate 110 which is typically a glass wafer having a plurality of openings 115, 116. The openings 115, 116 are separated by a portion 117 of the second glass substrate 110.

The openings 115, 116 can be of different size as they are used for forming different thick metal structures which electrically contact different regions of the respective semiconductor chips 200. In further embodiments, the second glass substrate 110 has only one opening for every semiconductor chip 200, for example in case of a power diode integrated into the semiconductor chip 200.

The openings 115, 116 of the second glass substrate 110 can also be wet-chemically formed using a mask. Alternatively, laser milling can be used.

The second glass substrate 110 is, different to the first glass substrate 100, single-sided processed as no step portion is needed here. However, double-sided processing is also possible if desired.

Figure 2C:
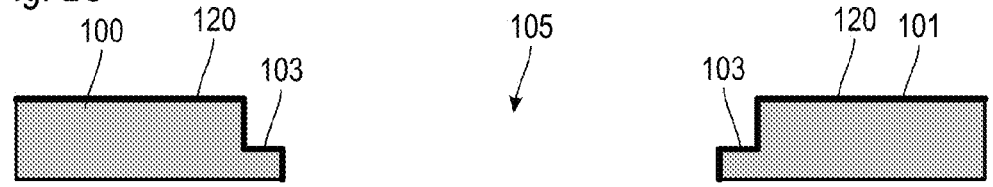

In a further process as illustrated in FIG. 2C, an electrically conductive seed layer 120 is formed at least on the first side 101 of the first glass substrate 100 and on side walls of the receptacle 105. The seed layer 120 is a connected layer so that all portions of the seed layer 120 are electrically connected, and is used for the later plating process.

The seed layer 120 can be formed, for example, by Physical Vapour Deposition (PVD) or Chemical Vapour Deposition (CVD). A single metal layer or a metal layer stack can be used as seed layer 120. An example is a Ti/Ag stack.

Figure 2D:
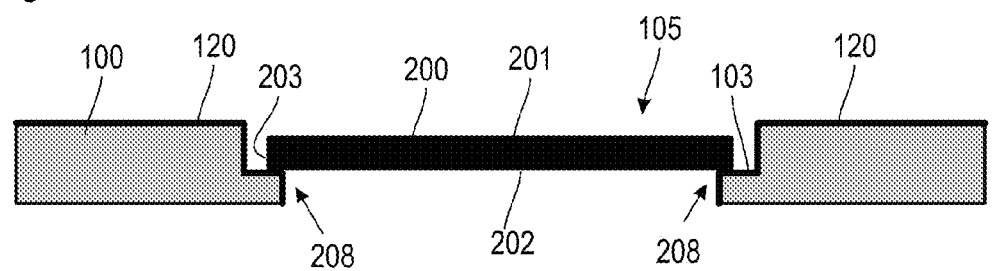

In a further process as illustrated in FIG. 2D, a semiconductor chip 200 having a first side 201, a second side 202, a lateral rim 203 and a peripheral region 208 at the lateral rim 203 is placed or housed in the receptacle 105. The semiconductor chip 200 is arranged with the peripheral region 208 in contact with the seed layer 120 in the peripheral stepped region 103 of the receptacle 105.

The receptacle 105 leaves at least portions of the first side 201 and of the second side 202 of the semiconductor chips 200 exposed. In the embodiment of FIG. 2D, the first side 201 remains completely exposed while the second side 202 remains exposed except the peripheral region 208.

The second side 112 of the second glass substrate 110 is then joined with the first side 101 of the first glass substrate 100 with the seed layer 120 between the first and the second glass substrate 100, 110 as illustrated in FIG. 2E. The openings 115 and 116 are aligned with respective metallization regions formed on the first side 201 of the semiconductor chip 200 to keep these metallization regions exposed. This is explained in more detail in connection with FIG. 3.

To join the first and second glass substrate 100, 110, an adhesive bonding layer formed by adhesive material 130 can also be formed prior to the joining process. For example, an epoxy resin can be used which are commercially available and generally withstand permanent temperatures T<250° C. The resin can be printed or rolled on the first side 101 of the first glass substrate 100 and/or on the second side 112 of the second glass substrate 110. A glass solder, for example a glass frit, which can be applied by stencil-print-processes, can also be used. A glass solder can withstand generally temperatures T<400° C.

As illustrated in FIG. 2F, the arrangement of the joined first and second glass substrate 100, 110, which can also be referred to as composite substrate or composite wafer, is then turned upside down. Moderate mechanical pressure and temperature is then applied to establish a firm bond between the first and second glass substrate 100, 110.

The semiconductor chip 200 can also be gently pressed against the second side 112 of the second glass substrate 110 to be joined with the second glass substrate 110. As pressure is applied, the adhesive material 130 between the first and the second glass substrate 100, 110 is pressed into the open space formed between the stepped portion 103 of the first glass substrate 100 and portions of the second glass substrate 110 which covers the rim 203 of the semiconductor chip 200. The open space forms a circumferential groove 109. In addition to fixing the parts together, the adhesive material 130 also serves as electrical insulation and protects the lateral rim 203 of the semiconductor chip 200. This is described further below. The adhesive material 130 can partially or completely fill the circumferential groove 109.

FIG. 2F shows that an outer edge of the openings 115, 116 of the second glass substrate 110 is inwardly recessed with respect to the peripheral stepped portion 103 of the first glass substrate 100 and also with respect to the rim 203 of the semiconductor chip 200. The circumferential groove 109 is thus formed by the second glass substrate 110 together with the peripheral stepped portion 103 of the first glass substrate 100. The semiconductor chip 200 engages with the circumferential groove 109 along the peripheral region 208 of the semiconductor chip 200. The semiconductor chip 200 is thus enclosed by the first and the second glass substrate 100, 110 along its peripheral region 208.

The joined first and the second glass substrate 100, 110 form a wafer stack, typically a glass wafer stack, with each semiconductor chip 200 fixed in the circumferential groove 109 of the receptacles 105. The second side 102 of the first glass substrate 100 forms a second side of the wafer stack, while the first side 111 of the first glass substrate 110 forms a first side of the wafer stack. The wafer stack can also be described as insulating carrier structure or composite structure for carrying the semiconductor chips 200.

In a further process as illustrated in FIG. 2G, the resulting formed insulating carrier structure with the joined first and second glass substrate 100, 110 and the semiconductor chip 200 is turned over so that the first side 201 of the semiconductor substrate 200 faces up again. A further electrically conductive seed layer 125 is formed at least on side walls of the openings 115, 116 of the second glass substrate 110 and on the exposed portions of the first side 201 of the semiconductor chips 200. The further seed layer 125 can be formed by the same processes and materials as used for the seed layer 120.

Figure 2H:
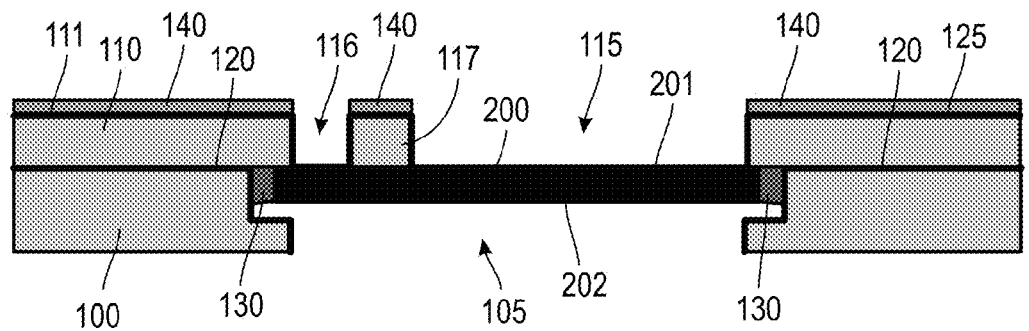

FIG. 2H illustrates a further process that includes forming an insulating layer 140 on the first side 111 of the second glass substrate 110 to cover the further seed layer 125 while leaving the further seed layer 125 on the side walls of the openings 115, 116 and on the first side 201 of the semiconductor chips 200 exposed.

The insulating layer 140 can be printed or rolled, or applied by any other coating process, on planar surfaces of the first side 111 of the second glass substrate 110. The insulating layer 140 covers the planar portions of the second glass substrate 110 to prevent that metal is plated on these regions.

Figure 2I:
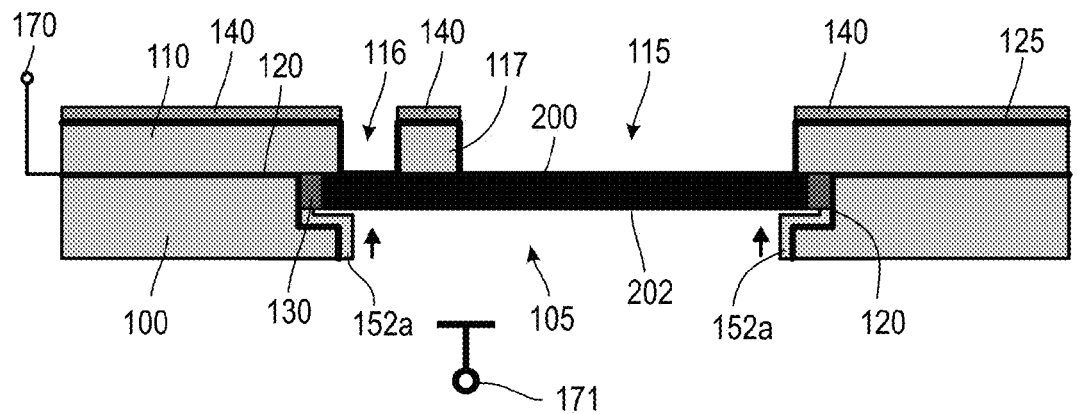

In a further process, metal is plated in the receptacle 105 to form a metal structure 152 on and in contact with the second side 202 of the semiconductor chip 200. For electroplating, which is typically used as it allows selective plating on surfaces only which have an electrically connected seed layer, the seed layer 120, which is partially arranged between the first and the second glass substrate 100, 110, is electrically contacted at selected regions, for example at the outer edge of the wafer stack formed by the first and the second glass substrate 100, 110. The electrical contact to the seed layer 120 is schematically shown in FIG. 2I at 170. The counterelectrode is illustrated at 171.

At the beginning of the plating process, while electrically contacting the seed layer 120 on an outer region the metal is only deposited on the stepped portion 103 and the inner wall portions of the receptacles at the second side 102 of the first glass substrate 100, as the semiconductor chip 200 remains electrically insulated from the seed layer 120 by the adhesive material 130. As a result, an initial or first plating layer 152a is formed. The main growth direction at the beginning of the plating process is indicated in FIG. 2I by arrows.

Figure 2J:
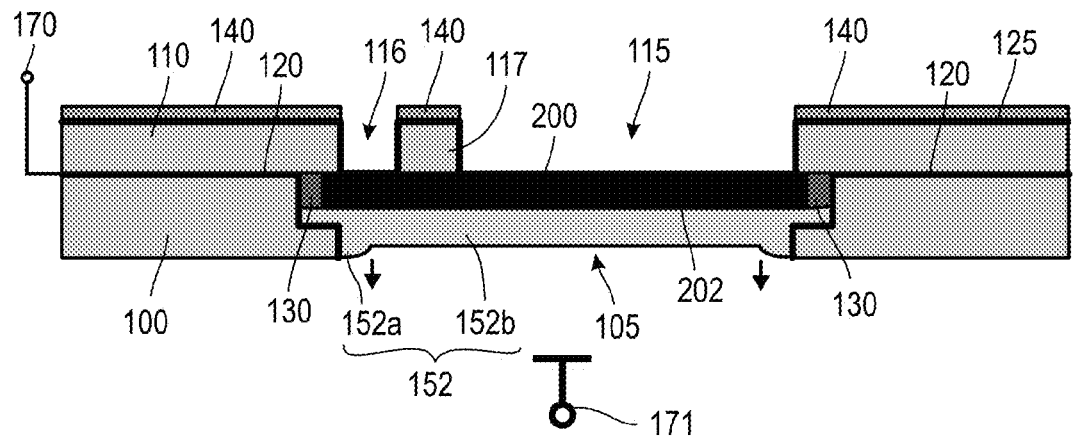

When the initial plating layer 152a grows and contacts the exposed second side 202 of the semiconductor chip 200, the back-side metallization of the semiconductor chip 200 becomes electrically connected with the seed layer 120, and the deposition of the metal on the second side 202 of the semiconductor chip 200 starts to form a main or second plating layer 152b. This is illustrated in FIG. 2J. The main growth direction is reversed, and the metal structure 152 grows from the semiconductor chip 200 downwards in FIG. 2J. As the orientation of the wafer stack during metal plating can be different from the orientation illustrated in FIG. 2J, the downward growth only indicates the growth direction toward the second side 102 of the wafer stack. This process can also be described as a back-side plating process.

The resulting metal structure 152 is formed by the initial plating layer 152a and the main plating layer 152b. As the growth is a continuous process, no interface is observable between these plating layers.

The plated metal can overgrow the second side 102 to a given extend if desired, and can be planarized by mechanical grinding or polishing at a later process.

The plated metal can be Cu and/or Ni, for example. The thickness of the plated metal structure 152 can be at least 30 μm as described above. Typically, Cu is plated as Cu is superior in electrical and thermal conductivity.

Electroplating allows formation of metal structures 152 at a higher deposition rate than usual deposition processes. Moreover, deposition can be controlled by providing only those regions with a seed layer where metal regions shall be formed. Furthermore, electroplating will only take place on seed layers which are electrically contacted. Hence, the deposition of metal by electroplating allows pattern plating. Furthermore, a subsequent structuring of the metal regions 152 is not needed.

Figure 2K:
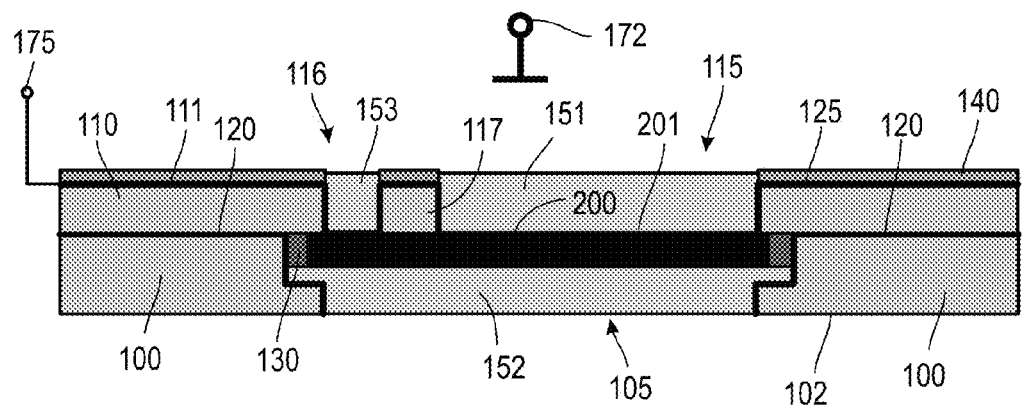

FIG. 2K illustrates a plating process at the first side 101 of the glass substrate 110 into the respective openings 115, 116 and on the exposed portions of the semiconductor chip 200. The plating results in the formation of further metal structures 151, 153 on and in contact with the first side 201 of the semiconductor chips (200). The same materials can be used for this front-side plating process. For this front-side plating process, the further seed layer 125 is electrically connected at selected regions indicated at 175, which are typically arranged in peripheral regions of the wafer stack formed by the first and second glass substrate 100, 110. The counterelectrode is indicated at 172.

FIGS. 2J to 2K show a sequential plating at the first and second side 201, 202 of the semiconductor chip 200. The order of the plating processes can also be reversed. Furthermore, the plating can be carried out at the same time on both sides. In this case, both the seed layer 120 and the further seed layer 125 are electrically contacted.

The plating processes also fill gaps between the glass substrate 100, 110 and the semiconductor chip 200 which is beneficial for encapsulating the semiconductor chip 200. This also improves mechanical stability and heat dissipation. Typically, no voids remain in the metal structure 152 and the further metal structures 151 and 153.

Figure 2L:
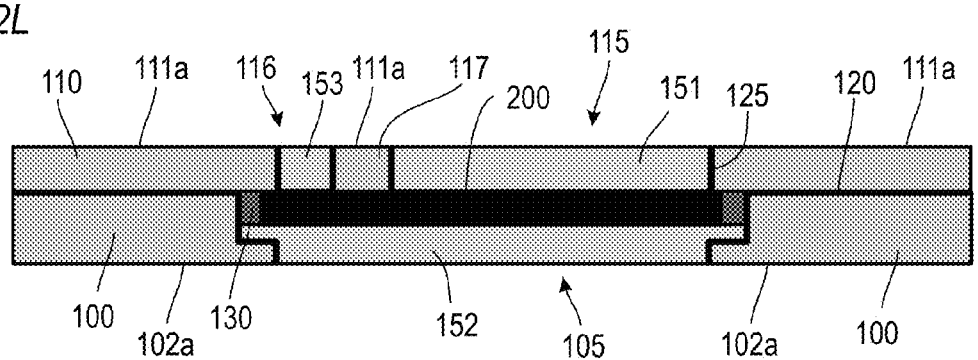

In a further process, as illustrated in FIG. 2L, the first side 111 of the second glass substrate 110 and/or the second side 102 of the first glass substrate 100 is ground. Grinding can include grinding of the respective glass substrates 100, 110 and the respective metal structures 151, 152, and 153, for example, to remove overgrown material forming temporal electrical connections between adjacent metal structures.

The grinding can also be used for thinning the wafer stack. Furthermore, both the glass material and the metal can be ground in a common mechanical grinding process using, for example, a porous abrasive material with reduced clogging of the pores. Suitable grinding wheels are, for example, available from DISCO Corporation, Japan.

The thickness of the wafer stack can be reduced to about 500 μm, which is still sufficiently thick to be mechanically stable. The final thickness ratio between the back-side metallization and/or the front-side metallization of the semiconductor chip 200 and the respective metal structures 151, 152, 153 after grinding can be between about 1:50 to about 1:300.

The grinding or mechanical processing of both sides of the wafer stack leads to a processed first side 111a and a processed second side 102a of the wafer stack.

Figure 2M:
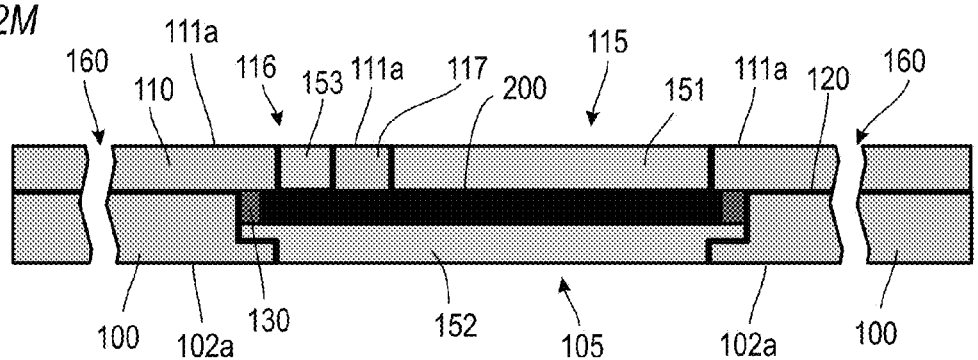

In a further process, as illustrated in FIG. 2M, the wafer stack is cut along cutting lines which run between adjacent semiconductor chips 200 or groups of semiconductor chips if hybrid devices including at least two separate semiconductor chips 200 are desired. The cutting is illustrated in FIG. 2M by break lines 160. Instead of scribing and breaking, sawing or laser cutting can also be used.

Figure 3:
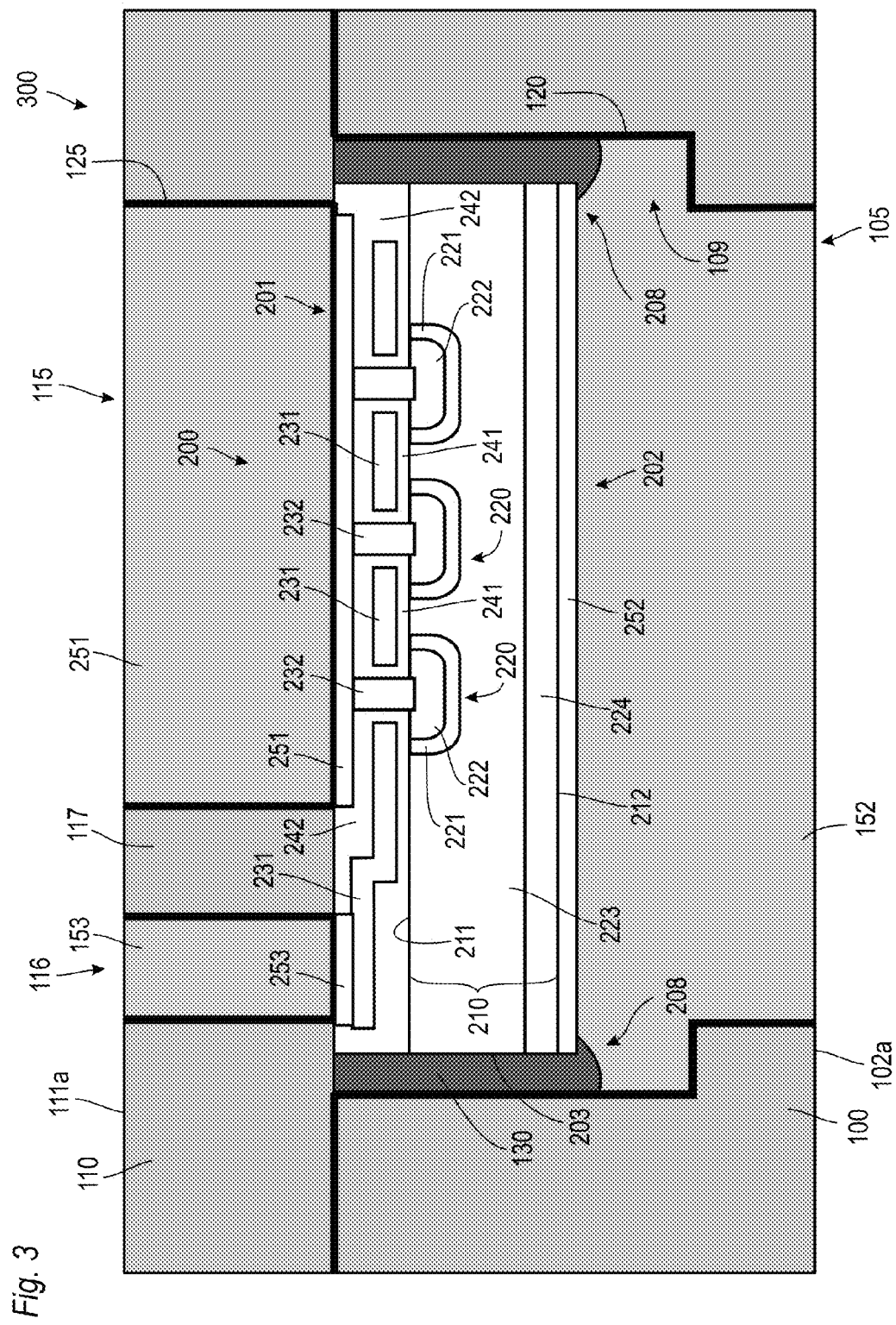
FIG. 3 illustrates a semiconductor device, according to an embodiment.

FIG. 3 illustrates a semiconductor device 300 formed by any of the above processes. The device 300 includes the wafer stack formed by the joined first and second glass substrate 100, 110 and a single semiconductor chip 200 accommodated in the annular groove 109 formed between the first and the second glass substrate 100, 110.

The semiconductor chip 200 includes a semiconductor component, which is in this embodiment a power FET without being limited thereto.

The semiconductor component can be typically a power semiconductor component such as a two-terminal component or a three-terminal component. Examples of two-terminal devices are pn-diodes and Schottky-diodes, while examples of three-terminal devices are FETs and IGBTs. These components are typically vertical components having at least one electrode formed by a first metallization 251 on the first side 202 of the semiconductor chip 200 and at least another electrode formed by a second metallization 252 on the second side 202 of the semiconductor chip 200. The first side 201 of the semiconductor chip 200 can be, for example, the front-side of the semiconductor component, where, for example, the source region of a FET is arranged. The second side 202 of the semiconductor chip 200 can be, for example, the back-side of the semiconductor component, where, for example, the drain region of a FET is arranged.

While FIG. 3 shows the first side 201 upwardly facing, it is also possible to reverse the orientation of the semiconductor chip 200.

The semiconductor chip includes a semiconductor material 210 having a drift region 223. Source regions 221 and body regions 222 are formed at a first side 211 of the semiconductor material 210 while a drain region 224 and an optional field stop region between the drain region 224 and the drift region 221 are formed at a second side 212 of the semiconductor material 210. The source and body regions 221, 220 form respective cells 220 of the power FET.

A drain metallization 252 is formed on the second side 212 of the semiconductor material 210 in contact with the drain region 224. The drain metallization 252 forms here a back-side metallization.

A source metallization 251 and a gate metallization 253 are formed on the first side 211 of the semiconductor material 210. The source metallization 251 is electrically connected with the source regions 221 by source plugs 232. The gate metallization 253 is electrically connected with a gate electrode structure 231. Electrical insulation is provided by a gate dielectric 241, which is arranged between the gate electrode structure 231 and the first side 211 of the semiconductor substrate 210, and by an insulating layer or layer stack 242. The source and gate metallizations 251, 253 form here separate portions of a front-side metallization of the semiconductor chip 200.

As further illustrated in FIG. 3, the drain metallization 252, the source metallization 251 and the gate metallization 253 are exposed on the second and first side 202, 201, respectively, of the semiconductor chip 200. The openings 115 and 116 of the second glass substrate 110 are adapted to the size of the source metallization 251 and the gate metallization 253 and are aligned therewith. Typically, the openings 115 and 116 are smaller than the lateral extension of the gate metallization 253 and the source metallization 251 to compensate any misalignment between the second glass substrate 110 and the semiconductor chip 200. The metal structures 151, 153 are formed to be in direct contact with these metallizations 251, 253 through the further seed layer 125. No soldering layer is formed between the metal structures 252, 251 and the source and gate metallization 251, 253, respectively.

The metal structure 152 is in direct contact with the drain metallization 252 as no seed layer has been formed on the second side 202 of the semiconductor chip 200. The upper and exposed layer of the drain metallization 252 is therefore typically adapted to promote plating. For example, an Ag layer can be used as the exposed layer.

FIG. 3 also illustrates that the adhesive material 130 can partially cover the second side 202 of the semiconductor chip 200 in the peripheral region 208. As the adhesive material 130 is urged into the circumferential groove 109 upon pressing the first glass substrate 100 and the second glass substrate 110 such covering can occur. This improves the mechanical fixing of the semiconductor chip 200 and improves insulation of the lateral rim 203.

FIGS. 4A and 4B illustrates a variation of the processes which includes formation of electrical bridges to electrical connect the metal structures. The electrical bridges are formed integrally with the metal structures.

The processes are basically the same as described above, except that the first glass substrate 400 additionally includes trenches 408 formed at the second side 402 of the first glass substrate 400 between selected receptacles 405. The bottoms of the trenches 408 are recessed from the second side 402 of the first glass substrate 400. The trenches 408 can be formed by wet-chemical etching or laser milling.

FIG. 4A illustrates the wafer stack after plating while FIG. 4B illustrates the wafer stack after grinding and cutting using a cutting tool 480. As shown in FIG. 4B, the metal structures 152 of the adjacent semiconductor chips 200 remain electrically connected by an electrical bridge or connection 154 integrally formed with the respective metal structures 152. The bridge 154 forms together with the metal structures 152 a lead frame embedded in the first glass substrate 400. The lead frame is exposed on the processed second side 402a of the wafer stack.

As further shown in FIG. 4B, semiconductor chips 200 which are electrically connected by the bridge 154 are not separated from each other by cutting and form together a semiconductor device 500 which includes at least two, typically a given number of semiconductor chips 200 which are electrically connected to form a circuit. The cut lines runs between groups of separate semiconductor chips 200. Hybrid circuits with integrally or in situ formed lead frames are thus formed. An example is the combination of an IGBT with a diode which forms the body diode of the IGBT.

In a further variation, electrical bridges can also be formed at the first side of the wafer stack between the further metal structures 151 and 153. This allows formation of circuits without any bonding wires or soldering processes. The comparably thick metal structures 151, 152 and 153 on both sides of the semiconductor chip 200 additionally improves heat dissipation as they together form a large volume to absorb and dissipate heat pulses.

According to an embodiment, a semiconductor device includes an insulating carrier structure 100, 110 made of an insulating inorganic material. The carrier structure 100 includes at least one receptacle 105. A semiconductor chip 200 having a first side 201, a second side 202 and a lateral rim 203 is disposed in the receptacle 105, wherein the insulating carrier structure 100, 110 laterally surrounds the lateral rim 203 of the semiconductor chip 200. A metal structure 152 is arranged on and in contact with the second side 202 of the semiconductor chip 200 and embedded in the insulating carrier structure 100, 110.

According to a further embodiment, the insulating carrier structure 100, 110 includes a circumferential groove 109 encompassing the peripheral region 208 of the semiconductor chip 200. The semiconductor chip 200 can be fixed in the circumferential groove 109 by an adhesive.

According to an embodiment, the semiconductor chip 200 includes a semiconductor material 210 having a first doping region 221 formed in the semiconductor material 210 at a first side 211 of the semiconductor material 210, and a second doping region 224 formed in the semiconductor material 210 at a second side 212 of the semiconductor material 210. The first doping region 221 is in electrical connection with a first metallization 251 formed on the first side 211 of the semiconductor material 210. The second doping region 224 is in electrical connection with a second metallization 252 formed on the second side 212 of the semiconductor material 210. The second metallization 252 is covered by and in electrical contact with the metal structure 152.

According to an embodiment, the first metallization 251 is covered by and in electrical contact with a further metal structure 151.

According to an embodiment, the semiconductor device includes at least two receptacles 405 each supporting a separate semiconductor chip 200. Each semiconductor chip 200 is provided with a metal structure 152 at the second side of the wafer stack. The semiconductor device further includes an electrical connection formed by a metal bridge 154 embedded in the insulating carrier structure. The metal bridge 154 electrically connects the metal structures 152 of the separate semiconductor chips 200 and forms together with the metal structures 152 a common lead frame.

Herein are described processes for manufacturing a device which includes a semiconductor chip held by a carrier substrate or an insulating carrier structure. The device further includes an in situ formed lead frame in contact with the semiconductor chip. The lead frame is embedded in the carrier substrate or the insulating carrier structure.

Separate semiconductor chips can be commonly processed to integrally form lead structures and other metal structures for each semiconductor chip without the need of separate bonding processes.

For manufacturing a semiconductor device having two or more separate semiconductor chips 200, the semiconductor chips 200 are placed in the receptacles 405 of the carrier substrate 400 or insulating carrier structure 400, 110. At this stage, the semiconductor chips 200 are not electrically connected with each other and are spaced and electrically insulated from each other by the carrier substrate 400 (insulating carrier structure 400, 111). Electrical connections 154 between the semiconductor chips 200 are formed together with metal structures 152 by plating metal into the receptacles 405 and trenches 408 formed in the carrier substrate 400 on one or both sides. The metal structures 152 and the electrical connections 154 form together a common lead frame. The semiconductor chips 200 can be of the same or of different kinds. For example, power diodes and power FETs can be combined in a single semiconductor device.

As described herein, according to an embodiment, a carrier substrate 100 is provided which has a plurality of receptacles 105, 405 each for receiving and carrying a semiconductor chip. Semiconductor chips 200 are arranged in the receptacles 105, 405, and metal is plated in the receptacles 105 to form respective metal structures 152 on and in contact with the semiconductor chips 200. The carrier substrate 100 is cut to form separate semiconductor devices 300, 500, 600.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for manufacturing semiconductor devices, comprising:
providing a carrier substrate having a first side, a second side and a plurality of receptacles, the receptacles extending from the first side to the second side of the carrier substrate, wherein the carrier substrate comprises an inorganic insulating material, wherein the receptacles extend through the inorganic insulating material;
placing semiconductor chips each having a first side and a second side in the receptacles, wherein the receptacles leave at least portions of the first side and of the second side of the semiconductor chips exposed;
plating metal in the receptacles to form a metal structure on and in contact with the second side of the semiconductor chips; and
cutting through the carrier substrate to form separate semiconductor devices,
wherein each of the receptacles are sized and shaped for receiving and carrying one of the semiconductor chips.

2. The method of claim 1, wherein each semiconductor chip comprises a peripheral region, and wherein the respective semiconductor chip is placed with the peripheral region in contact with a peripheral stepped region of the respective receptacle.

3. The method of claim 1, further comprising:
forming a seed layer at least on the second side of the carrier substrate and on side walls of the receptacle.

4. The method of claim 1, wherein providing the carrier substrate comprises:
forming the receptacles by at least one of wet-chemical etching and laser milling.

5. The method of claim 1, wherein providing the carrier substrate comprises:
forming trenches in the second side of the carrier substrate between selected receptacles.

6. The method of claim 1, wherein the semiconductor chips are fixed in the receptacles by an adhesive bond.

7. The method of claim 1, wherein the inorganic insulating material comprises at least one of glass and ceramic.

8. The method of claim 1, further comprising:
providing a cover substrate comprising a first side, a second side, and a plurality of openings extending from the first side to the second side;
joining the second side of the cover substrate with the first side of the carrier substrate and with the first side of the semiconductor chips, wherein the openings of the cover substrate leave portions of the first side of the semiconductor chips exposed;

plating metal in the openings of the cover substrate to form at least a further metal structure on and in contact with the first side of the semiconductor chips; and cutting through the cover substrate and the carrier substrate to form the separate semiconductor devices.

9. The method of claim 8, further comprising:
forming a seed layer at least on side walls of the openings of the cover substrate and on the exposed portions of the first side of the semiconductor chips before plating the metal.

10. The method of claim 9, further comprising:
forming an insulating layer on the first side of the cover substrate to cover the seed layer while leaving the seed layer on the side walls of the openings and on the first side of the semiconductor chips exposed.

11. The method of claim 8, further comprising:
grinding at least one of the first side of the cover substrate and the second side of the carrier substrate.

12. The method of claim 8, wherein the cover substrate comprises at least one of glass and ceramic.

13. The method of claim 3, wherein plating metal comprises forming a first plating layer on the seed layer such that the first plating layer contacts the second side of the semiconductor chip, and forming a second plating layer on the second side of the semiconductor chip, wherein the first and second plating layer form together the metal structure.

14. A method for manufacturing semiconductor devices, comprising:
providing a carrier substrate having a first side, a second side and a plurality of receptacles, the receptacles extending from the first side to the second side of the carrier substrate;

placing semiconductor chips each having a first side and a second side in the receptacles, wherein the receptacles leave at least portions of the first side and of the second side of the semiconductor chips exposed;

providing a cover substrate comprising a first side, a second side, and a plurality of openings extending from the first side to the second side;

joining the second side of the cover substrate with the first side of the carrier substrate and with the first side of the semiconductor chips, wherein the openings of the cover substrate leave respective portions of the first side of the semiconductor chips exposed; and plating metal in the receptacles and the openings to form at least a first metal structure on and in contact with the first side of the semiconductor chips, and a second metal structure on and in contact with the second side of the semiconductor chips, wherein each of the receptacles are sized and shaped for receiving and carrying one of the semiconductor chips.

15. The method of claim 14, wherein providing the carrier substrate comprises:
forming trenches in the second side of the carrier substrate between selected ones of the receptacles, wherein the trenches connect the selected ones of the receptacles and are filled with metal to form an electrical connection between the respective second metal structures of the selected semiconductor chips.

16. The method of claim 1, wherein the semiconductor chips are placed in the receptacles such that the second side faces and is physically supported by the carrier substrate.

17. A method for manufacturing semiconductor devices, comprising:
providing a carrier substrate having a first side, a second side and a plurality of receptacles, the receptacles extending from the first side to the second side of the carrier substrate, wherein the carrier substrate comprises an inorganic insulating material and wherein the receptacles extend through the inorganic insulating material of the carrier substrate;

placing semiconductor chips each having a first side and a second side in the receptacles, wherein the receptacles leave at least portions of the first side and of the second side of the semiconductor chips exposed;

plating metal in the receptacles to form a metal structure on and in contact with the second side of the semiconductor chips; and cutting through the carrier substrate to form separate semiconductor devices.

18. The method of claim 17, wherein each semiconductor chip comprises a peripheral region, and wherein the respective semiconductor chip is placed with the peripheral region in contact with a peripheral stepped region of the respective receptacle.

19. The method of claim 17, further comprising:
forming a seed layer at least on the second side of the carrier substrate and on side walls of the receptacle.

20. The method of claim 17, wherein providing the carrier substrate comprises:
forming trenches in the second side of the carrier substrate between selected receptacles.

21. The method of claim 17, wherein the semiconductor chips are fixed in the receptacles by an adhesive bond.

22. The method of claim 17, wherein the inorganic insulating material comprises at least one of glass and ceramic.

* * * * *